(12) United States Patent
Pleake et al.

(10) Patent No.: US 10,925,196 B1
(45) Date of Patent: Feb. 16, 2021

(54) DIMENSIONALLY-CONSTRAINED DEVICE FARADAY CAGE

(71) Applicant: Microsoft Technology Licensing, LLC, Redmond, WA (US)

(72) Inventors: Todd David Pleake, Sammamish, WA (US); John Terpsma, Redmond, WA (US); Ketan Shah, Redmond, WA (US); David Carter Vandervoort, Seattle, WA (US); Keith Walter Kaatz, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/537,295

(22) Filed: Aug. 9, 2019

(51) Int. Cl.
*H05K 9/00* (2006.01)
*H05K 7/20* (2006.01)

(52) U.S. Cl.
CPC ....... *H05K 9/0032* (2013.01); *H05K 7/20445* (2013.01); *H05K 9/0022* (2013.01); *H05K 9/0088* (2013.01)

(58) Field of Classification Search
CPC ... H05K 7/20445; H05K 9/0022–0028; H05K 9/003; H05K 9/0032; H05K 9/0035; H05K 9/0088
See application file for complete search history.

(56) References Cited

U.S. PATENT DOCUMENTS

| | | | |
|---|---|---|---|
| 5,825,634 A | 10/1998 | Moorehead et al. | |
| 5,847,317 A * | 12/1998 | Phelps | H05K 9/0015 174/368 |
| 6,707,675 B1 | 3/2004 | Barsun et al. | |
| 8,833,772 B2 * | 9/2014 | Sasaki | H05K 5/061 277/639 |
| 9,468,086 B1 | 10/2016 | Yeini et al. | |
| 9,865,939 B2 * | 1/2018 | Luukkainen | H01R 13/2442 |
| 10,068,832 B2 | 9/2018 | Han et al. | |
| 2001/0006458 A1 * | 7/2001 | Uusimaki | H05K 9/0022 361/816 |
| 2005/0205280 A1 * | 9/2005 | Fursich | H05K 9/003 174/359 |
| 2006/0134982 A1 * | 6/2006 | Zarganis | H05K 9/003 439/607.01 |
| 2006/0260839 A1 * | 11/2006 | Krohto | H05K 9/003 174/377 |
| 2009/0008431 A1 * | 1/2009 | Zonvide | H05K 9/0015 228/179.1 |

(Continued)

OTHER PUBLICATIONS

"International Search Report and Written Opinion Issued in PCT Application No. PCT/US20/038573", dated Sep. 14, 2020, 15 Pages.

*Primary Examiner* — Jacob R Crum
(74) *Attorney, Agent, or Firm* — Rainier Patents, P.S.

(57) ABSTRACT

The description relates to devices, such as computing devices that can include dimensionally-constrained shielded circuit board assemblies. One example can include a circuit board that includes an upwardly extending fence. The example can also include a heat generating component positioned within the fence and a thermal module defining a major planar surface positioned over the heat generating component. The thermal module can include a downwardly extending frame that overlaps with the fence. The gasket can be compressed between the fence and the frame in a direction parallel to the major planar surface.

20 Claims, 7 Drawing Sheets

(56) References Cited

U.S. PATENT DOCUMENTS

| | | | |
|---|---|---|---|
| 2011/0090659 A1* | 4/2011 | Liao | H01L 23/552 |
| | | | 361/768 |
| 2014/0078679 A1 | 3/2014 | Tsunoda et al. | |
| 2014/0160699 A1* | 6/2014 | Zhang | H01L 23/552 |
| | | | 361/752 |
| 2015/0237769 A1 | 8/2015 | Carpenter et al. | |
| 2015/0245543 A1* | 8/2015 | Jang | H05K 9/0032 |
| | | | 361/760 |
| 2016/0181677 A1 | 6/2016 | Christopher et al. | |
| 2017/0052575 A1 | 2/2017 | Stellman et al. | |
| 2017/0172019 A1* | 6/2017 | Kurz | H05K 7/2039 |
| 2017/0181336 A1* | 6/2017 | Robinson | H05K 9/0032 |
| 2017/0374769 A1* | 12/2017 | Vehkapera | H05K 9/0024 |
| 2018/0199473 A1* | 7/2018 | Zhang | H05K 9/0032 |
| 2019/0001540 A1* | 1/2019 | Yui | F16J 15/10 |
| 2020/0163259 A1* | 5/2020 | Green | H05K 9/0018 |

\* cited by examiner

DIMENSIONALLY-CONSTRAINED DEVICE FARADAY CAGE

BACKGROUND

The description relates to dimensionally-constrained devices that have heat generating components and relates to cooling the heat generating components while providing electromagnetic shielding (e.g., RF shielding).

BRIEF DESCRIPTION OF THE DRAWINGS

The accompanying drawings illustrate implementations of the concepts conveyed in the present document. Features of the illustrated implementations can be more readily understood by reference to the following description taken in conjunction with the accompanying drawings. Like reference numbers in the various drawings are used wherever feasible to indicate like elements. Further, the left-most numeral of each reference number conveys the FIG. and associated discussion where the reference number is first introduced.

DESCRIPTION

The present concepts relate to devices, such as computing devices. For many form factors, such as tablets, notebooks, and/or wearable devices, consumer preferences are toward smaller form factors, especially thinner (e.g., z-dimension constraints) and/or lighter form factors. At the same time, consumers want high performance from computing resources (e.g., heat generating components), such as processing resources, memory resources, battery resources, etc. The high performance tends to result in unwanted heat generation from the heat generating components. This heat can be dispersed via thermal modules that can be positioned proximate to the heat generating components. The heat generating components are also shielded from ambient radio frequency energy (RF shielding) that can degrade their performance. Further, RF emissions (e.g., RF noise) from the heat generating components can be blocked so that they do not interfere with other device components, such as various antennas. Stated another way, the present concepts can relate to RF shielding in both directions (e.g., from and towards the heat generating components).

The present concepts can employ components in the devices that both contribute to positioning the thermal modules and the heat generating components as well as contributing to the RF shielding of the heat generating components. These components can conserve space in thin form factor devices in the z-dimension, among other advantages. These components can also offer reduced z-dimensions by eliminating additional components that contribute to z-height. Traditionally, a lid is placed over the thermal module to bias the thermal module against the heat generating component. The present implementations can eliminate the lid and thereby reduce thickness, cost, and/or complexity. In some cases, the components also contribute to repairability of the device (e.g., easier assembly and disassembly). These and other aspects are described below.

Figure 1:
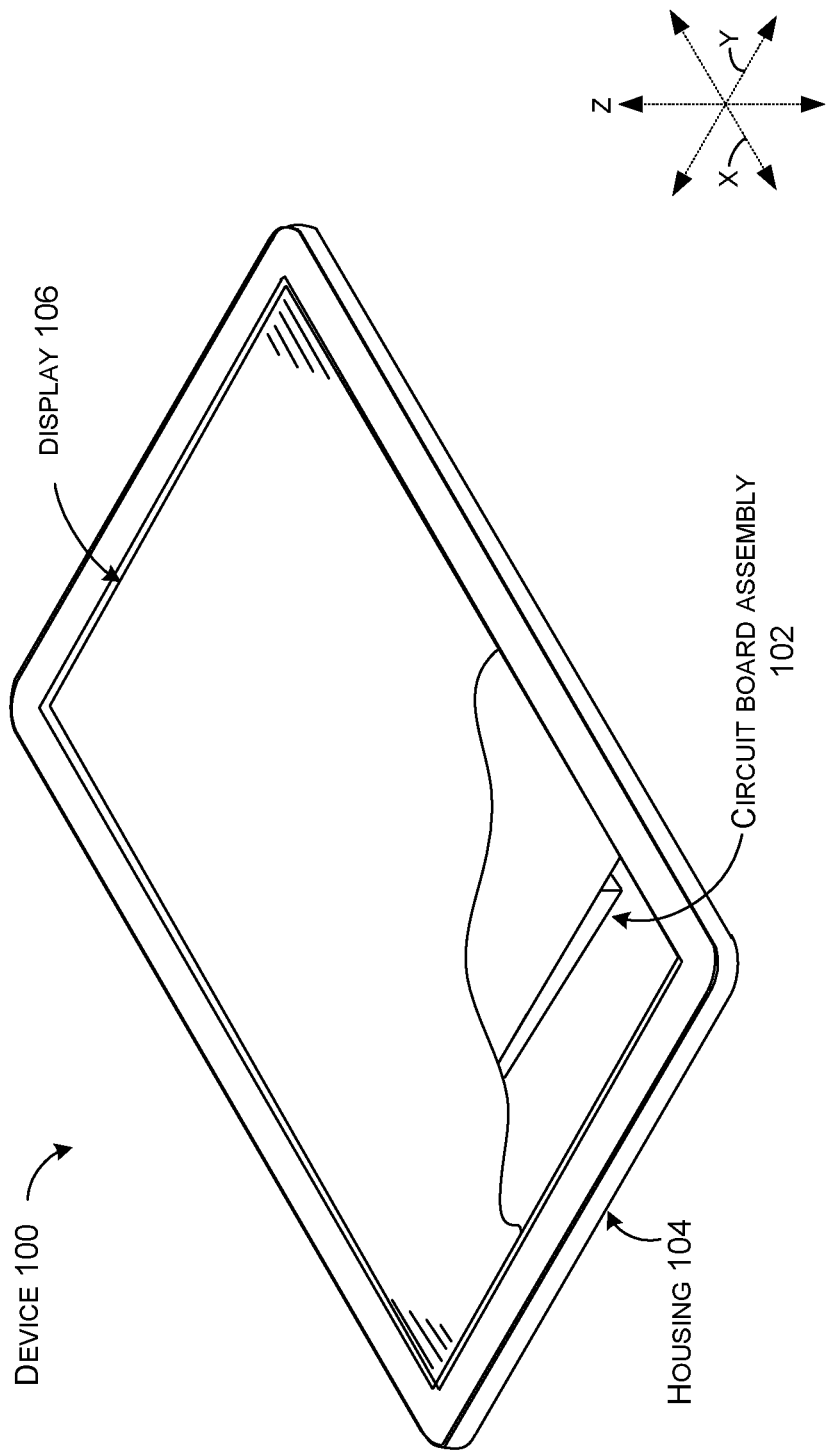
FIG. 1 is a partial cutaway perspective view of an example device that can include the present dimensionally-constrained shielded circuit board assembly implementations in accordance with the present concepts.

FIG. 1 shows a partial cut-away view of an example device 100 manifest as a tablet type computing device. In this manifestation, device 100 can include a dimensionally constrained shielded and cooled circuit board assembly 102 (hereinafter, "circuit board assembly") that in this example is contained within a housing 104 and a display 106. The circuit board assembly 102 can be employed in other device scenarios.

Figure 2A:
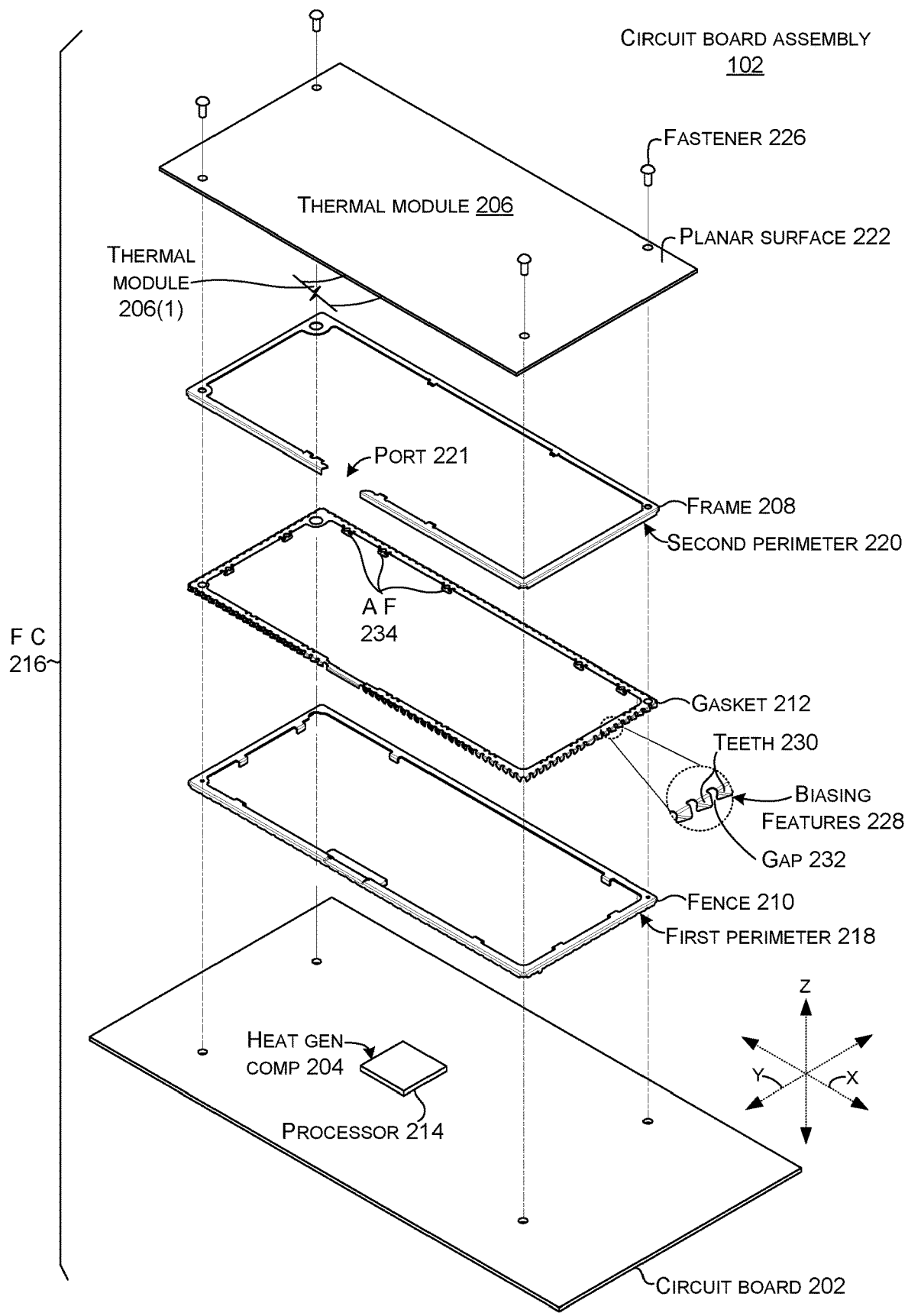
FIGS. 2A-2D are exploded perspective views of portions of the example dimensionally-constrained shielded circuit board assembly of FIG. 1.
Figure 2B:
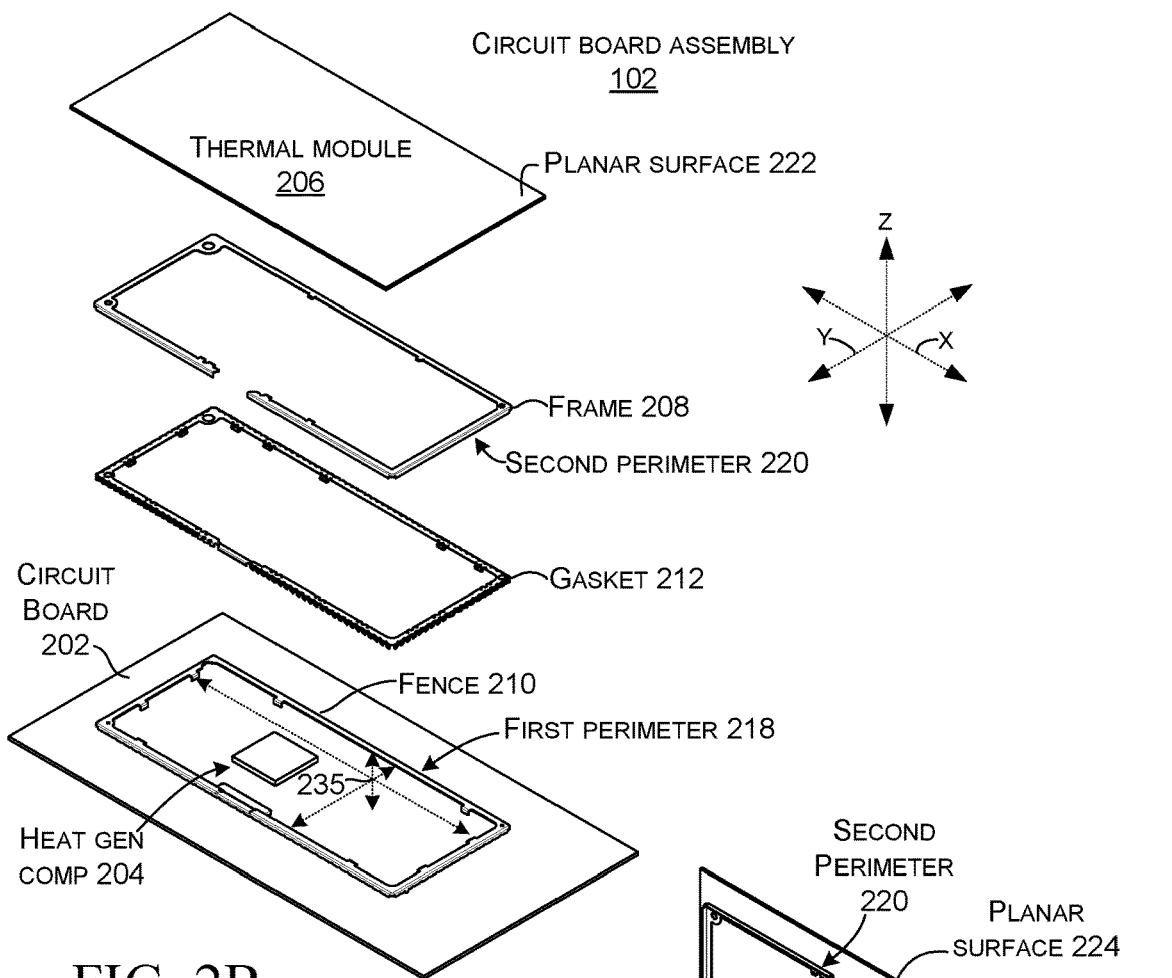
Figure 2C:
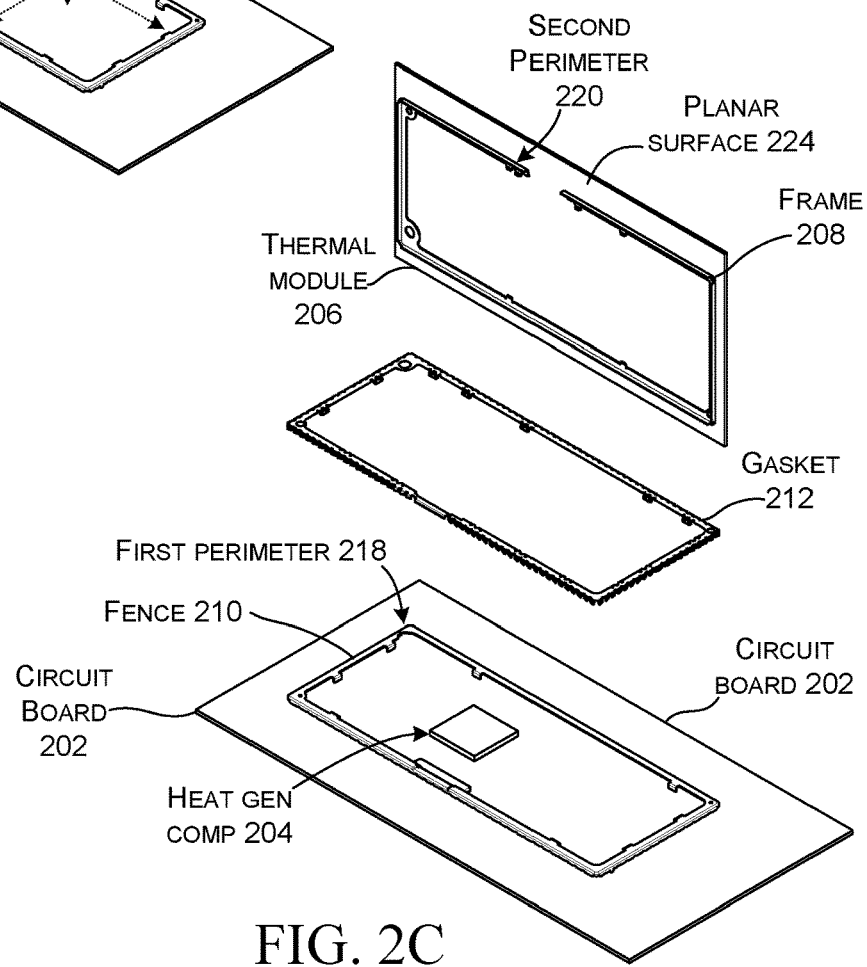
Figure 2D:
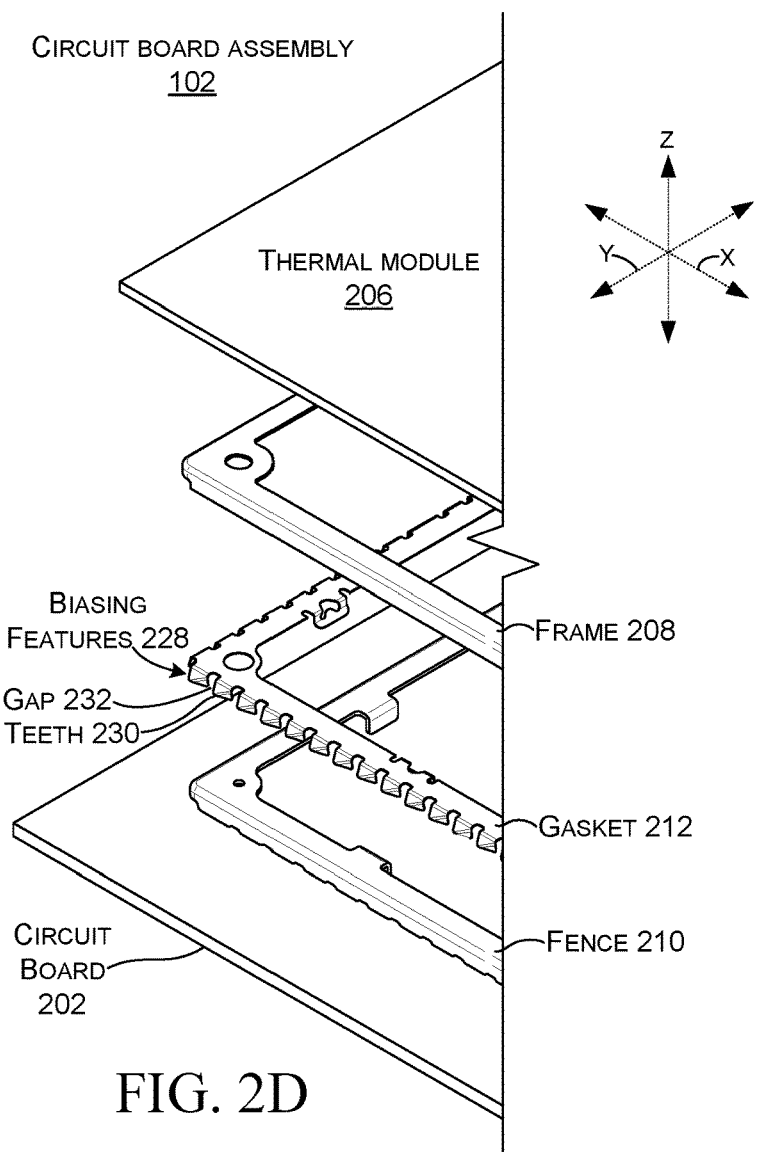
Figure 2E:
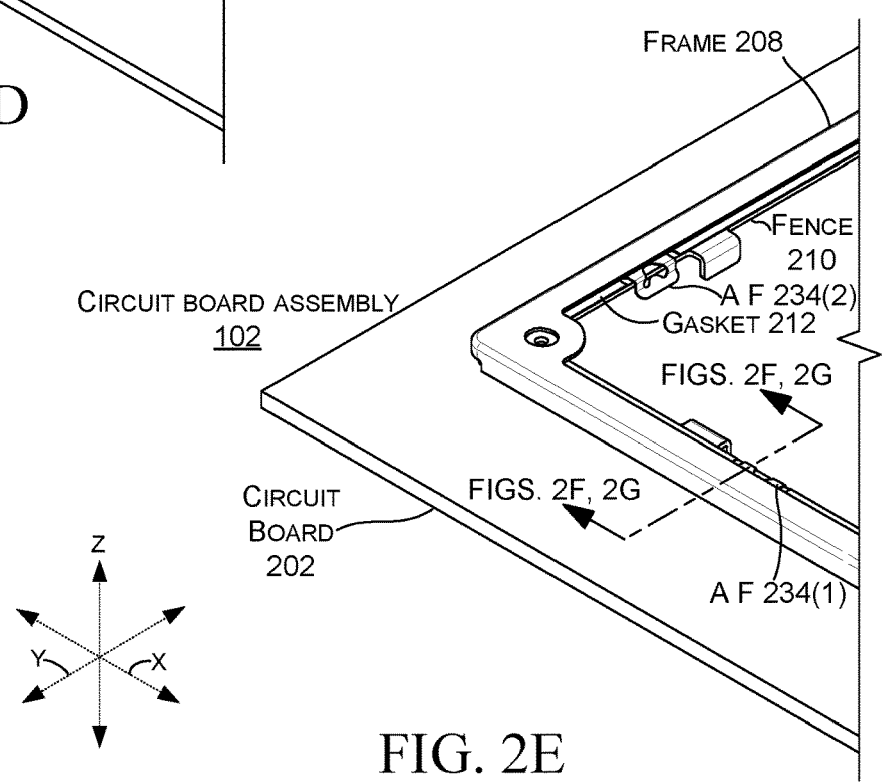
FIG. 2E is a perspective view of a portion of the example dimensionally-constrained shielded circuit board assembly of FIG. 1.
Figure 2F:
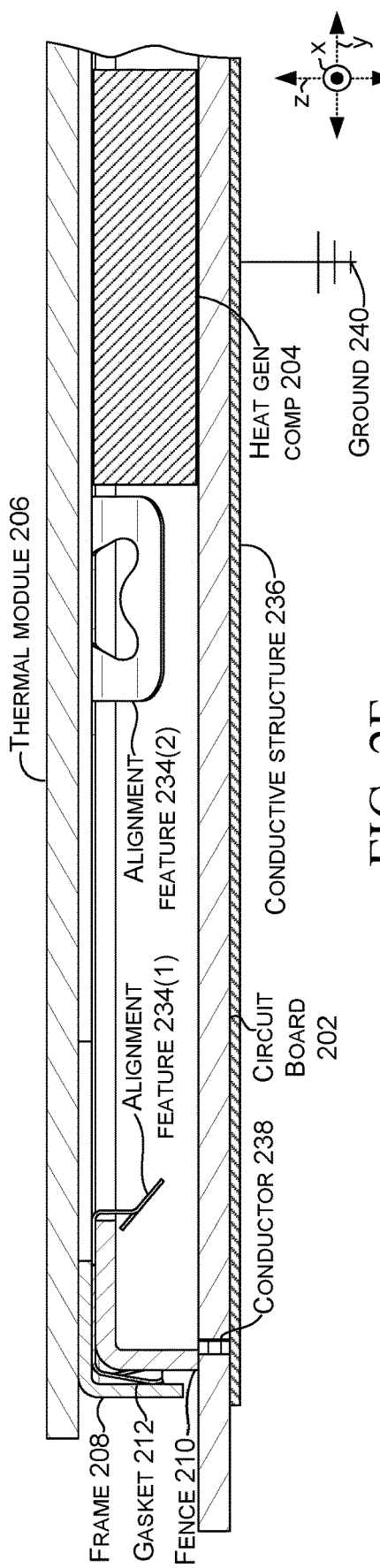
FIGS. 2F and 2G are sectional views of a portion of the example dimensionally-constrained shielded circuit board assembly as indicated in FIG. 2E.
Figure 2G:
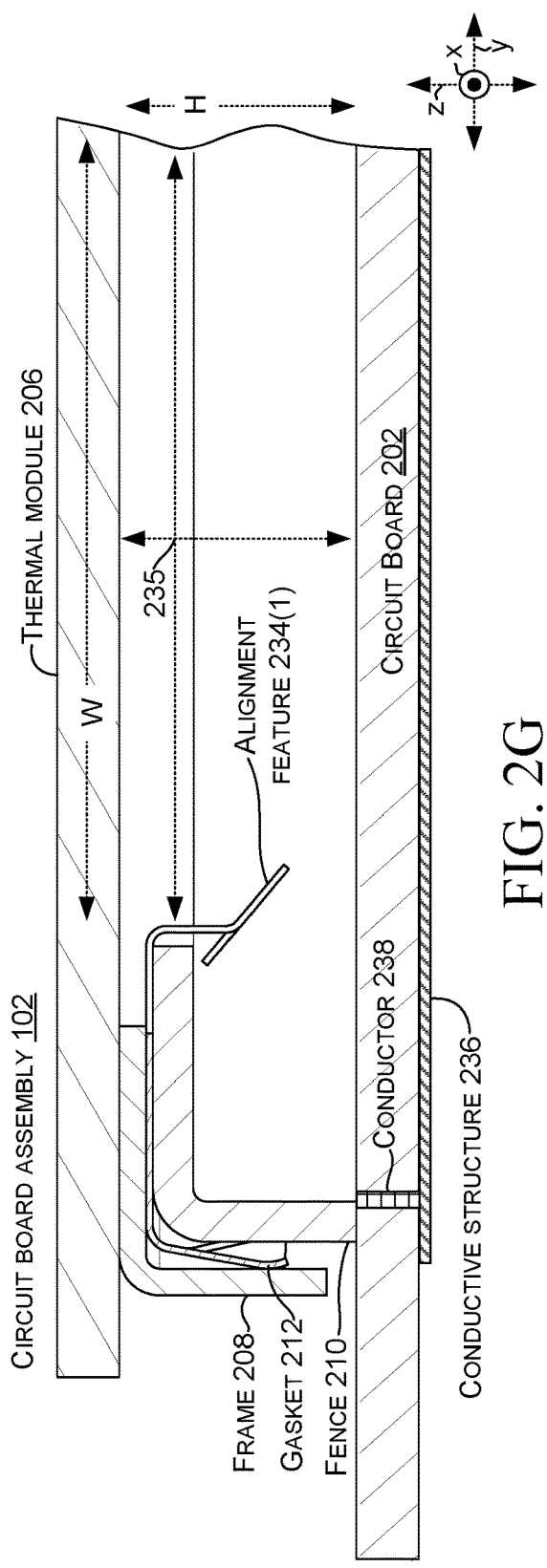

FIGS. 2A-2G collectively show features of circuit board assembly 102. FIGS. 2A-2D show exploded views of circuit board assembly 102. FIG. 2E shows a partially assembled view of circuit board assembly 102. FIGS. 2F and 2G are views of a portion of the circuit board assembly 102.

The circuit board assembly 102 can include a circuit board 202, a heat generating component 204, a thermal module 206, a frame 208, a fence 210, and a gasket 212. The circuit board 202 can be manifest as a printed circuit board (PCB) or a flexible printed circuit (FPC), among others. The heat generating component 204 can be positioned on the circuit board 202. The heat generating component can be manifest as a processor 214, such as a central processing unit (CPU), graphics processing unit (GPU), and storage/memory, a battery, and/or a transformer, among others. As will be explained in more detail below, circuit board 202, thermal module 206, frame 208, fence 210, and/or gasket 212 can form a Faraday cage 216 (e.g., RF shielding) around heat generating component 204.

The circuit board 202 can include fence 210 that extends upwardly toward thermal module 206. From one perspective, the fence 210 can define a first perimeter 218 and the heat generating component 204 can be located within the first perimeter 218.

The thermal module 206 can be manifest as a vapor chamber, a heat pipe, a heat spreader, a heat sink, and/or sheets of conductive material, such as copper or graphite, among other configurations. The thermal module 206 can include frame 208 which extends downwardly toward the circuit board 202. The frame 208 can be an integral part of the thermal module. For instance, the thermal module 206 with the frame 208 can be formed by additive manufacturing processes, such as 3D printing or can be formed by subtractive processing, such as machining. Alternatively, the frame 208 can be a separate component that is secured to the thermal module 206. For instance, the frame can be soldered, welded, and/or otherwise fused (e.g., secured) to the thermal module.

From one perspective, the frame 208 can define a second perimeter 220. The first perimeter 218 and the second perimeter 220 can be different so that the frame 208 can be contained within the fence 210, or vice versa (e.g., they bypass one another rather than abutting one another). Stated another way, the first and second perimeters (218 and 220)

can be offset from one another and the frame 208 and the fence 210 can be partially overlapping in the z-dimension.

Figure 5:
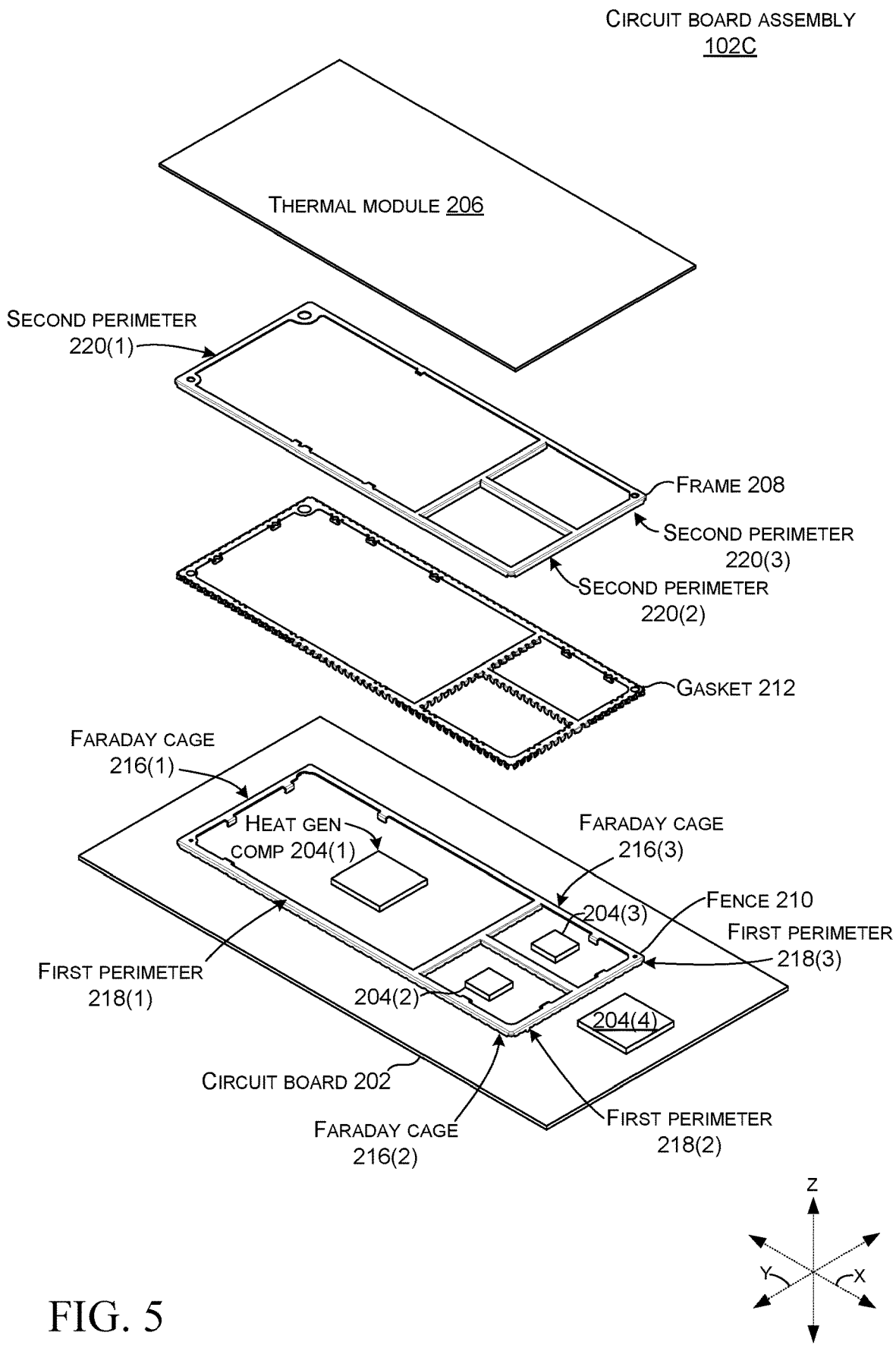
FIG. 5 is an exploded perspective view of an alternative dimensionally-constrained shielded circuit board assembly example in accordance with some implementations of the present concepts.

Note that this implementation includes a port 221 (FIG. 2A) through the frame 208, gasket 212, and fence 210 to allow a second thermal module 206(1) (FIG. 2A) to be thermally coupled to thermal module 206. The second thermal module 206(1) can be used to dissipate thermal energy to areas of the device not covered by thermal module 206. FIG. 5 shows another implementation that does not include the port 221.

The frame 208 can provide structural integrity to the thermal module 206. For instance, the thermal module 206 may have generally opposing major planar surfaces 222 (FIG. 2A) and 224 (FIG. 2C) in the xy-dimensions. The frame 208 may provide structural integrity that contributes to the thermal module 206 maintaining the planarity of the major planar surfaces 222 and 224. This can allow thinner (in the z-reference direction) thermal modules to be employed without them being subject to deformation during assembly and/or deformation when assembled. For instance, fasteners 226 can be utilized to bias the thermal module 206 against the heat generating component without deforming the planar nature of the thermal module 206. Thus, the frame 208 can contribute to overall thinner devices in the z-dimension.

Further, the present implementations are more serviceable than traditional designs. In traditional designs, the thermal module tends to be damaged if the device is disassembled. In the illustrated configuration, the fasteners 226 can be removed and the thermal module 206 can be removed undamaged, thanks in part to the structural support provided by the frame 208. Likely, no parts will be damaged and repairs can be made and the circuit board assembly 102 can be re-assembled. In the unlikely event there is damage, it will tend to occur to the gasket 212. The gasket 212 is a relatively simple and inexpensive element that tends to cost at least an order of magnitude less than the thermal module. A replacement gasket 212 can be installed on the fence 210 and re-assembly of the circuit board assembly 102 can be completed.

In such a configuration, the thermal module 206 can be positioned against the heat generating component 204 (directly contacting or via an intervening thermal interface material). The thermal module 206 may also approach fence 210. In this implementation, the gasket 212 can be positioned between the fence 210 and the thermal module 206. However, this implementation does not rely on the gasket 212 to seal (e.g., complete the Faraday cage 216) between the fence 210 and the thermal module 206. Instead, the gasket 212 can seal the Faraday cage 216 (e.g., eliminate RF leakage) between the frame 208 and the fence 210. For instance, the gasket 212 can bias the frame 208 and the fence 210 away from one another in the x and y-dimensions. For example, the gasket 212 may be compressed between the frame 208 and the fence 210 in the x and y-dimensions and exert a bias against the frame and the fence in the x and y-dimensions. Stated another way, the bias generated by the gasket 212 can be parallel to the major planar surfaces 222 and 224. The bias created by the gasket 212 with the frame 208 and the fence 210 can ensure adequate contact to avoid RF leakage between the gasket 212 and the frame 208 and/or between the gasket 212 and the fence 210.

Because the seal of the Faraday cage 216 is created by the gasket 212 against the frame 208 and the fence 210, dimensional variations in the z-dimension can be accommodated. For instance, the fasteners 226 can be tightened until the thermal module 206 contacts the heat generating component 204. Recall that the fence 210 and the frame 208 bypass one another so variations from specified dimensions (e.g. design tolerances) of the heat generating component 204 and the thermal module 206 can be accommodated. This accommodation can be achieved because the present concepts do not rely on z-dimension contact between the frame 208, fence 210, and gasket 212 to seal the Faraday cage 216. Instead, the xy-dimension contact between the frame 208, gasket 212, and fence 210 seals the Faraday cage 216 independent of z-dimension variation.

In some implementations, the gasket 212 may include biasing features 228 that create the bias between the frame 208 and the fence 210. In this case, the biasing features 228 are manifest as angled teeth 230 (FIG. 2A). Gaps 232 (FIG. 2A) between adjacent teeth 230 affect what wavelengths of RF signals are blocked by the Faraday cage 216. The biasing features can include other configurations. For instance, the biasing features could be a sinusoidal shape (e.g., extending in the y-reference direction and alternating in the + and − x-reference direction for the enlarged portion). In some configurations, the gasket 212 may include alignment features 234 that facilitate maintaining the gasket 212 relative to the fence 210 and/or the frame 208 during assembly.

The heat generating component 204 can be located within a volume 235 (FIGS. 2B and 2G) defined within the first and second perimeters 218 and 220 and between the circuit board 202 and the thermal module 206. The volume 235 provided by employing the present concepts can be greater than the volume of traditional designs for a given z-dimension height. For instance, the frame 208 and fence 210 can be viewed as having 'picture frame' configurations (e.g., a border or perimeter with no center). The picture frame configuration can allow heat generating components 204 to extend from the circuit board 202 to the thermal module 206 at a height H (FIG. 2G) for a majority of the volume 235 defined by width W (FIG. 2G) defined by the inward most portions of the frame 208 and/or fence 210. The increased volume 235 can allow more and/or larger heat generating components 204 to be positioned in contact with the thermal module 206 within the Faraday cage 216 despite the decreased overall dimensions in the z-dimension offered by elimination of the lid employed in traditional designs to force the thermal module against the heat generating component.

In this case, as mentioned above, the heat generating component 204 is manifest as a processor 214, such as a central processing unit (CPU) and/or graphics processing unit (GPU). Alternatively or additionally, heat generating components can include various communication circuitry, such as USB circuitry, Bluetooth circuitry, Wi-Fi circuitry, 4G circuitry, 5G circuitry, various electronic circuitry, storage, and/or batteries, among others. Some implementations can utilize fences, frames, and gaskets to isolate individual heat generating components from one another as well as from external RF energy. One such implementation is described below relative to FIG. 5.

FIGS. 2D and 2E show portions of the circuit board assembly 102. FIG. 2D is an exploded perspective view and FIG. 2E is a similar perspective view with the thermal module 206 removed. FIG. 2E shows the gasket's alignment feature 234(2) interacting with fence 210. The interaction can maintain alignment of the gasket 212 to the fence 210 and/or can keep the gasket and the fence assembled together (e.g., keep the gasket from popping off of the fence during the assembly process). FIGS. 2F and 2G are sectional views of the circuit board assembly 102 as indicated in FIG. 2E.

FIG. 2G is similar to FIG. 2F, but shows an enlarged view of a portion of the circuit board assembly.

As mentioned above, the circuit board 202 can contribute to the Faraday cage 216 (e.g., the bottom of the Faraday cage 216). This aspect is visible in FIGS. 2F and 2G. In this case, the circuit board 202 can include an electrically conductive structure 236. The electrically conductive structure 236 can be positioned under the heat generating component 204. In this example, the electrically conductive structure 236 is on the underside (e.g., opposite side from the thermal module 206) of the circuit board 202. The electrically conductive structure 236 can be electrically coupled to the fence 210 by one or more conductors 238 that pass through the circuit board 202. The electrically conductive structure 236 can also be electrically connected to device ground 240 (FIG. 2F). Thus, the electrically conductive structure 236 and the conductors 238 contribute to the Faraday cage 216 as part of the circuit board 202. In this case, the electrically conductive structure 236 is an additive layer on the underside of the circuit board 202. In other cases, the electrically conductive structure can be incorporated within the circuit board, such as a layer of conductive particles mixed into a layer of the circuit board material.

The implementations illustrated relative to FIGS. 2A-2G can be thinner in the z-dimension than existing designs, can employ fewer components, allow more lateral room in the x and/or y dimensions for heat generating components within the Faraday cage, and/or can be readily assembled and dis-assembled.

Figure 3:
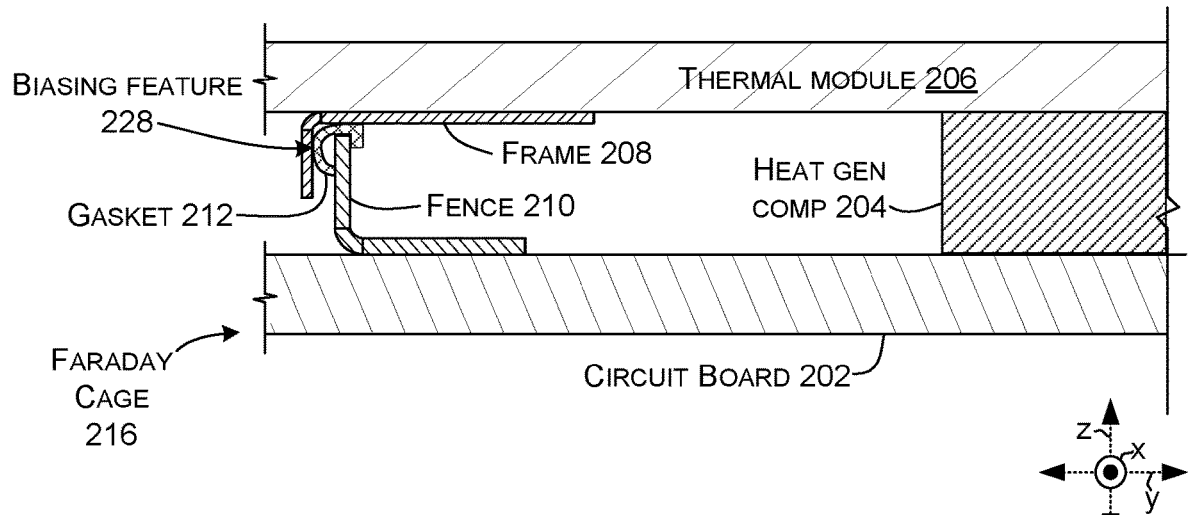
FIGS. 3 and 4 are sectional views of alternative dimensionally-constrained shielded circuit board assembly examples in accordance with some implementations of the present concepts.
Figure 4:
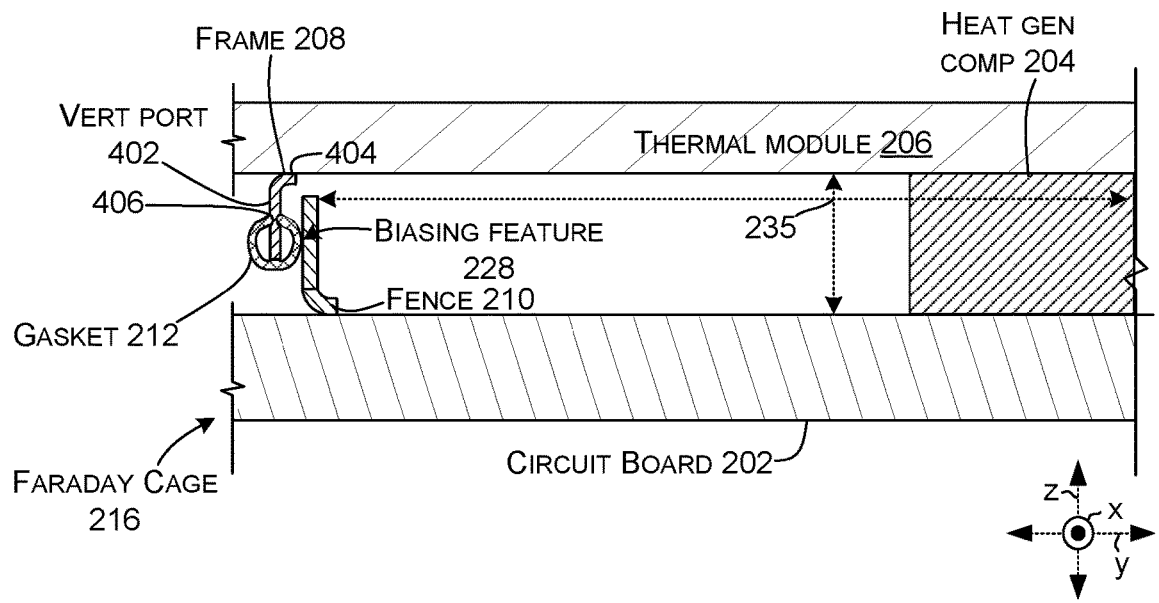

FIGS. 3 and 4 show alternative circuit board assemblies 102A and 102B, respectively. (The suffixes 'A' and 'B' indicate that some aspects of these circuit board assemblies are different from those of circuit board assembly 102 described above and/or from one another. Elements introduced above relative to FIGS. 2A-2G are not re-introduced here for sake of brevity).

FIG. 3 shows circuit board assembly 102A where the gasket 212 can be friction fit onto the fence 210. The frame 208 (previously secured to the thermal module 206) can be forced over the gasket and fence to 'load' the gasket 212. For instance, the gasket 212 can be formed from a resilient or springy material, such as spring steel or other conductive material. Forcing the frame over the gasket can compress the gasket in the x-dimension in this view (and similarly in the y-dimension). The resiliency of the gasket 212 can then create an outward bias in the x-dimension against the frame 208 and the fence 210. This bias can ensure consistent contact between the gasket 212, the frame 208 and the fence 210 to seal the Faraday cage 216.

FIG. 4 shows another example circuit board assembly 1028. In this implementation, the gasket 212 is friction fit onto a vertical portion 402 of the frame 208. The gasket 212 does not extend over the fence 210 (e.g., between the fence and the frame in the z-reference dimension). Stated another way, the gasket 212 does not extend along a horizontal portion 404 of the frame 208.

In this case, the gasket 212 can be manifest as a split tube (extending into and out of the drawing page in the y-reference direction in this sectional view) or other form factor. The frame 208 and/or the gasket 212 may include alignment features to facilitate maintaining an intended position of the gasket on the frame. In this case, the frame 208 includes alignment features 406 in the form of dimples into which the split tube may be positioned. The split tube can be formed of a resilient material so that the (rounded) portion of the tube positioned between the fence 210 and the frame 208 functions as biasing feature 228. The biasing feature 228 can create a force against the fence 210 and the frame 208 in the x- and y-dimensions, which can ensure consistent contact and hence RF sealing between the fence and the frame without the gasket occupying space in the z-dimension, such as between the fence 210 and the frame 208 or between the fence 210 and the thermal module 206.

FIG. 5 shows an alternative circuit board assembly 102C. (The suffix 'C' indicates that some aspects of this circuit board assembly are different from those of circuit board assemblies 102, 102A, and/or 1028 described above. Elements introduced above relative to FIGS. 2A-2G, 3, and/or 4 are not re-introduced here for sake of brevity).

Circuit board assembly 102C is able to shield multiple heat generating components 204, both from external RF energy and from RF energy from each other. In this case, the first perimeter 218 formed by fence 210 that can include multiple first perimeters (218(1), 218(2), and 218(3)): one around heat generating component 204(1); one around heat generating component 204(2), and one around heat generating component 204(3). Similarly, the second perimeter 220 formed by frame 208 includes multiple second perimeters (220(1), 220(2), and 220(3)): one around heat generating component 204(1); one around heat generating component 204(2), and one around heat generating component 204(3). The multiple first and second perimeters (218 and 220) contribute to a Faraday cage 216 around each of the individual heat generating components 204(1)-204(3).

The individual Faraday cages 216(1)-216(3) serve to provide RF shielding to individual heat generating components 204(1)-204(3) from RF energy from one another as well as from external RF energy, such as may be generated by unshielded heat generating component 204(4). This RF shielding can be viewed as bi-directional (e.g., protecting heat generating components within the Faraday cage from external RF energy and protecting other heat generating components and/or other external components from RF energy generated by the heat generating components within the Faraday cages). This RF shielding can be achieved while maintaining the reduced z-dimensions and/or increased internal (e.g., shielded volumes) described above relative to FIGS. 2A-4.

In the described implementations, frame 208, fence 210, and/or gasket 212 can be manifest as electrically conductive materials, such as composites or various metals like copper or stainless steel, for example. In some cases, the gasket can have a resilient nature, such as may be provided by spring steel, among other materials.

The present dimensionally-constrained shielded circuit board assembly concepts can be utilized with various types of devices, such as computing devices that can include but are not limited to notebook computers, tablet type computers, smart phones, wearable smart devices, gaming devices, entertainment consoles, and/or other developing or yet to be developed types of devices. As used herein, a computing device can be any type of device that has some amount of processing and/or storage capacity and/or other heat generating components. A mobile computing device can be any computing device that is intended to be readily transported by a user.

Various examples are described above. Additional examples are described below. One example includes a device comprising a circuit board that includes an upwardly extending fence that defines a first perimeter, a heat generating component positioned within the first perimeter, a thermal module positioned over the heat generating component, the thermal module including a downwardly extending frame that defines a second perimeter that is different than the first perimeter, and a gasket that creates a bias between the fence and the frame that contributes to blocking radio frequency energy between the fence and the frame to complete a Faraday cage around the heat generating component.

Another example can include any of the above and/or below examples where the circuit board further comprises an electrically conductive structure positioned below the first perimeter and electrically coupled to the fence.

Another example can include any of the above and/or below examples where the electrically conductive structure is incorporated into the circuit board or wherein the electrically conductive structure is external to the circuit board.

Another example can include any of the above and/or below examples where the electrically conductive structure, the fence, the frame, the gasket, and the thermal module form the Faraday cage around the heat generating component.

Another example can include any of the above and/or below examples where the heat generating component comprises a processor and/or memory.

Another example can include any of the above and/or below examples where the thermal module comprises a vapor chamber, a heat pipe, a heat spreader, or a heat sink.

Another example can include any of the above and/or below examples where the thermal module includes a planar surface and wherein the bias is generally parallel (e.g., +/−30 degrees) to the planar surface.

Another example can include any of the above and/or below examples where the gasket extends between the fence and the thermal module, or wherein the gasket does not extend between the fence and the thermal module.

Another example can include any of the above and/or below examples where the gasket is formed at least in part from a metal.

Another example can include any of the above and/or below examples where the gasket is formed from spring steel.

Another example can include any of the above and/or below examples where the heat generating component comprises multiple heat generating components and wherein the first perimeter defined by the fence comprises multiple first perimeters, and wherein individual heat generating components are positioned in individual first perimeters.

Another example can include any of the above and/or below examples where the frame defines multiple second perimeters and wherein the multiple first perimeters, the multiple second perimeters, and the gasket form multiple Faraday cages around the multiple heat generating components such that the individual heat generating components are shielded from one another.

Another example includes a device comprising a circuit board that includes an upwardly extending fence, a heat generating component positioned within the fence, a thermal module defining a major planar surface positioned over the heat generating component, the thermal module including a downwardly extending frame that overlaps with the fence, and a gasket compressed between the fence and the frame in a direction parallel to the major planar surface.

Another example can include any of the above and/or below examples where the circuit board, the thermal module, the fence, the frame, and the gasket form a Faraday cage around the heat generating component.

Another example can include any of the above and/or below examples where the gasket is sinusoidal in shape between the frame and the fence, or wherein the gasket comprises multiple teeth extending between the frame and the fence.

Another example can include any of the above and/or below examples where the gasket extends between the fence and the thermal module, or wherein the fence contacts the thermal module.

Another example can include any of the above and/or below examples where the gasket includes alignment features to maintain alignment of the gasket with the fence and/or wherein the gasket includes alignment features to maintain alignment of the gasket aligned with the fence and the frame.

Another example can include any of the above and/or below examples where the frame provides structural integrity to the thermal module to maintain planarity of the major planar surface.

Another example includes a device comprising a circuit board that includes an upwardly extending fence, a heat generating component positioned within the fence, a thermal module positioned over the heat generating component, the thermal module including a downwardly extending frame that is offset from the fence, and a gasket extending between the fence and the frame but not over the heat generating component.

CONCLUSION

Although techniques, methods, devices, systems, etc., pertaining to dimensionally-constrained shielded circuit board assemblies are described in language specific to structural features and/or methodological acts, it is to be understood that the subject matter defined in the appended claims is not necessarily limited to the specific features or acts described. Rather, the specific features and acts are disclosed as example forms of implementing the claimed methods, devices, systems, etc.

The invention claimed is:

1. A device, comprising:
a circuit board extending along a plane, the circuit board including a fence that extends upwardly from the plane and that defines a first perimeter;
a heat generating component positioned within the first perimeter;
a thermal module positioned over the heat generating component, the thermal module including a frame that extends downwardly toward the plane and that defines a second perimeter that is different than the first perimeter such that the frame overlaps the fence and a space exists between the overlapping frame and fence; and,
a gasket that is not part of either the fence or the frame and that extends parallel to the plane between the fence and the frame and is compressed between the fence and the frame to create a bias that is parallel to the plane and that forces the gasket against the fence and the frame to fill the space to block radio frequency energy between the fence and the frame to complete a Faraday cage around the heat generating component.

2. The device of claim 1, wherein the circuit board further comprises an electrically conductive structure positioned below the first perimeter and electrically coupled to the fence.

3. The device of claim 2, wherein the electrically conductive structure is incorporated into the circuit board, or wherein the electrically conductive structure is external to the circuit board.

4. The device of claim 2, wherein the electrically conductive structure, the fence, the frame, the gasket, and the thermal module form the Faraday cage around the heat generating component.

5. The device of claim 1, wherein the heat generating component comprises a processor and/or memory.

6. The device of claim 1, wherein the thermal module comprises a vapor chamber, a heat pipe, a heat spreader, or a heat sink.

7. The device of claim 1, wherein the thermal module includes a planar surface that is parallel to the plane and wherein the bias is generally parallel to the planar surface.

8. The device of claim 7, wherein the gasket extends between the fence and the thermal module, or wherein the gasket does not extend between the fence and the thermal module.

9. The device of claim 1, wherein the gasket is formed at least in part from a metal.

10. The device of claim 9, wherein the gasket is formed from spring steel.

11. The device of claim 1, wherein the heat generating component comprises multiple heat generating components, and wherein the first perimeter defined by the fence comprises multiple first perimeters, and wherein individual heat generating components are positioned in individual first perimeters.

12. The device of claim 11, wherein the frame defines multiple second perimeters, and wherein the multiple first perimeters, the multiple second perimeters, and the gasket form multiple Faraday cages around the multiple heat generating components such that the individual heat generating components are shielded from one another.

13. A device, comprising:
a circuit board extending along a plane and that includes a fence extending upwardly from the plane;
a heat generating component secured relative to the circuit board within the fence;
a thermal module defining a major planar surface that is parallel to the plane and is biased against the heat generating component in heat receiving relation, the thermal module including a downwardly extending frame that overlaps with the fence; and,
a gasket that is not part of either the fence or the frame and that is compressed between the fence and the frame at least in part in a direction parallel to the major planar surface to block radio frequency energy from passing between the fence and the frame.

14. The device of claim 13, wherein the circuit board, the thermal module, the fence, the frame, and the gasket form a Faraday cage around the heat generating component.

15. The device of claim 13, wherein the gasket is sinusoidal in shape between the frame and the fence, or wherein the gasket comprises multiple teeth extending between the frame and the fence.

16. The device of claim 13, wherein the gasket extends between the fence and the thermal module but not between the thermal module and the heat generating component, or wherein the fence contacts the thermal module.

17. The device of claim 13, wherein the gasket includes alignment features to maintain alignment of the gasket with the fence and/or wherein the gasket includes alignment features to maintain alignment of the gasket with the fence and the frame.

18. The device of claim 13, wherein the frame provides structural integrity to the thermal module to maintain planarity of the major planar surface.

19. A device, comprising:
a circuit board that includes an upwardly extending fence;
a heat generating component positioned over the circuit board and within the fence;
a thermal module positioned over and biased against the heat generating component, the thermal module including a downwardly extending frame that is offset from the fence; and,
a gasket that is not part of the fence or the frame and extends between the fence and the frame but not over the heat generating component, the gasket blocking at least some wavelengths of radio frequency energy from passing between the fence and the frame.

20. The device of claim 19, wherein the thermal module is positioned over the heat generating component in direct contact with the heat generating component, and wherein the thermal module is biased directly against the heat generating component without a lid.

* * * * *